United States Patent [19]

Uchida

[11] Patent Number: 4,626,097
[45] Date of Patent: Dec. 2, 1986

[54] PROCESS FOR PREPARING PRINTING PLATES

[75] Inventor: Seiichi Uchida, Moriguchi, Japan

[73] Assignee: Osaka Seihan Center Kyogyo Kumiai, Osaka, Japan

[21] Appl. No.: 623,778

[22] Filed: Jun. 22, 1984

[30] Foreign Application Priority Data

Jun. 28, 1983 [JP] Japan .................................. 58-117217

[51] Int. Cl.⁴ ............................................. G03B 27/32
[52] U.S. Cl. ........................................ 355/77; 355/32; 355/85
[58] Field of Search .................... 355/77, 85, 32, 40

[56] References Cited

U.S. PATENT DOCUMENTS

| | | | |
|---|---|---|---|
| 874,222 | 12/1907 | Mertens | 355/77 |
| 1,916,282 | 7/1933 | Peacock | 355/40 |
| 2,420,636 | 5/1947 | Yule | 355/77 |

Primary Examiner—Monroe H. Hayes
Attorney, Agent, or Firm—Hubbard, Thurman, Turner & Tucker

[57] ABSTRACT

A process comprising the steps of preparing from a positive original transparent film pieces bearing the image of the original in a positive form for color separation, fixedly laying out each of the film pieces on a transparent film for each of the separated colors, and making a printing plate for each color with use of the transparent film having the film piece thereon.

6 Claims, 7 Drawing Figures

FIG. 3
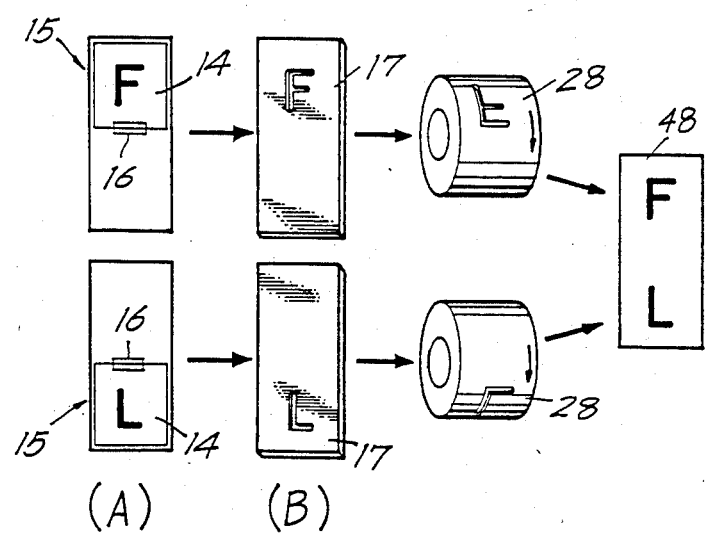
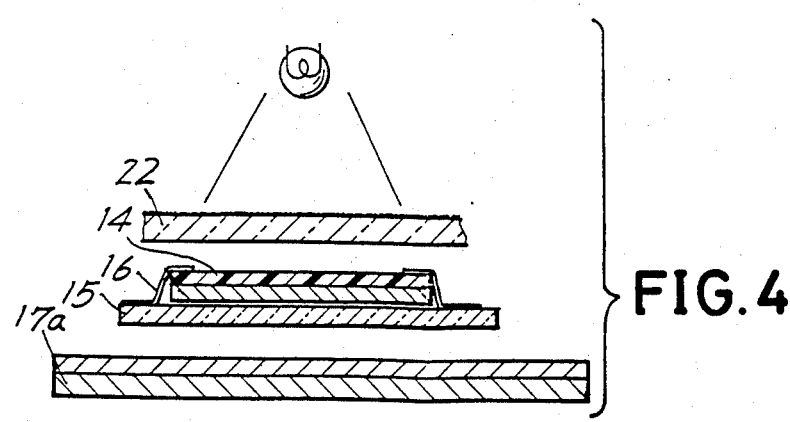
FIG. 4

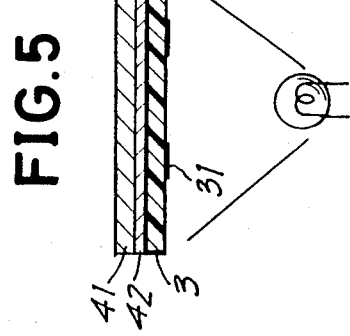

PROCESS FOR PREPARING PRINTING PLATES

BACKGROUND OF THE INVENTION

The present invention relates to a process for preparing printing plates, especially for those useful for printing on corrugated boards.

The process of the invention is useful for plates for printing not only on corrugated boards but also for usual paper materials.

Preparation of printing plates usually requires a complex process including many steps as seen in FIG. 7. The conventional process will be described with reference to the case where for a better understanding, the characters "F" and "L" roughly sketched as at 1 are to be printed in different colors.

Step a

The characters are drawn on paper in specified colors to prepare originals 2 for printing plates.

Step b

The originals 2 are photographed by a letterpress camera on an enlarged or reduced scale corresponding to the print 6 to be made, to obtain negative films 3.

The letterpress camera is provided with a front mirror and adapted to photograph reflected images. The image of the original, which is reflected from the mirror and passes through the lens, is projected onto the coating of the film as an inverted normal image having the original right-to-left relationship. Accordingly when the negative film 3 is turned through 180 degrees, the image as seen from the film substrate side is an erect reverse image as seen in FIG. 7(b).

It is to be noted that in the letterpress printing process, the term "normal image" or "reverse image" refers to the image as seen through the film substrate, with the photosensitive coating side of the film positioned outward and does not refer to the image as seen directly on the coated surface of the film. Thus, the reverse image on the negative 3 is a normal image when it is viewed directly on the coated surface.

Step c

Each negative film 3 is placed on the coating 42 of photosensitive paper 41 with the film substrate in intimate contact therewith and with the coated film surface 31 out ashown in FIG. 5, and the paper is exposed to light to obtain a print 4 bearing the image as a positive normal image.

Step d

The print 4 is cut to a piece of paper 5 having a suitable size and bearing the image. The pieces 5 are arranged on a mounting board 7 of the same size as the print 6 to be obtained, the surface of the board 7 is cut away in the same size as the pieces 5, and the pieces 5 are fitted into the mounting board 7, with the surfaces of the pieces 5 flush with the surface of the mounting board 7.

The layout obtained is identical with the printed layout on the print 6 to be finished with the exception of color.

Step e

The mounting board 7 with the layout of characters is photographed again with the letterpress camera to prepare identical negative films 8 bearing reverse images only and identical in number to the number of colors.

Step f

Only one image on one of the negative films 8 is obliterated with an opaque ink, while only the other image on the other negative film 8 is similarly inked out for color separation to obtain negative films 9 for the different colors.

Step g

Each of the negatives 9 is placed on a fresh film with the coated surface of the former in contact with the photosensitive surface of the latter, followed by exposure and printing to obtain a color separation film 10 bearing the image in the form of a positive normal image for the given color.

Step h

A plate-making color separation negative 12 is prepared from each film 10 using an enlarger 23 and a fresh film. When the printing plate 11 finally obtained is fitted around a printing roller for printing, an enlarged image will be obtained, so that the negative 12 is such that the image thereon is formed as contracted in the direction of rotation of the printing roller by an amount corresponding to the enlargement.

FIG. 6 shows the enlarger 23, in which the color separation film 10 is moved horizontally with the coated surface out, while the fresh film is fitted around a drum 24 and rotated at the same time. The color separation film 10 is exposed to light from above to form an image on the fresh film on the drum 24 through a mirror 25, lens 26 and slit 27 and obtain a print.

Since the peripheral speed of the drum 24 is slightly lower than the horizontal feed speed of the color separation film 10, the image of the film 10 is formed on the film over the drum 24 as a reverse image slightly contracted in the direction of rotation of the drum, whereby the plate-making color separation negative 12 is obtained.

Step i

A photosensitive flexible synthetic resin sheet (for forming a flexible relief printing plate) is exposed to light in intimate contact with each negative 12, whereby the exposed surface area of the resin sheet is chemically reacted and made insoluble. The unexposed area is etched away by a known chemical treatment to obtain a printing plate 11 having a reverse image in relief.

Each flexible printing plate 11 thus repared is set on a printing roller to print the image on paper 6 in color by letterpress printing.

Because the positive-negative relationship of the film, as well as of the photosensitive paper, is dependent on the kind of the photosensitive agent forming the coating, the foregoing description is merely exemplary of the conventional process. It is of course possible to print the image of a negative on photosensitive paper or film in intimate contact therewith to obtain a negative image.

The photosensitive agent coating the film and platemaking material may be such that it become soluble when exposed. In this case, it is possible to photograph an original of positive image to obtain a film bearing a positive image (positive-positive film).

The normal image-reverse image relationship is also not limitative; it is possible to photograph a normal image with a mirror- or prism-incorporating camera to obtain a normal image by reversing the image twice through the lens and prism.

Various plate making proceses have been practiced which resort to combinations of positive image-negative image relationship and normal image-positive image relationship.

The conventional process described above requires many steps for preparing finished prints and necessitates manual work for the step d of laying out the paper pieces 5 and fitting the pieces 5 into surface cutouts in the mounting board 7 and for the image inking-out and color separation step f, so that it has been thought impossible to automatically produce printing plates in large quantities.

Furthermore, the negative films 3, 8, photosensitive paper 4, mounting board 7 and color separation film 10 prepared are used only once and are not reusable. This renders the printing plate expensive to make.

While a sample of finished print must be approved of by the customer who placed an order for prints with the rough sketch 1, the plate maker shows the customer a print of the negative films 8 on sensitive paper obtained by contact printing or the mounting board layout 7 for this purpose. Accordingly in the event of a change in the customer's instructions, the same steps must be repeated again to comply with the customer's request. Further because the sample, i.e. the mounting board 7 or the print, bears positive images only, the conventional process involves the inconvenience that no color image sample is available before the process is executed to the final step (step i).

SUMMARY OF THE INVENTION

The present invention provides a process for preparing printing plates by a reduced number of steps.

The process of the prevent invention is characterized in that by laying out a positive image-bearing transparent film piece on a transparent film of the same size as the finished print to be obtained and using the layout directly for preparing a plate-making negative film or a printing plate.

The process wherein an image is laid out on a transparent film not only reduces the waste of film but also reduces the number of steps needed, making it possible to obtain a finished printing plate within a shortened period of time.

Further for multicolor printing, an image-bearing transparent film piece is laid out on a transparent film for each color, such that when all the transparent films are superimposed, the assembly shows how the print to be obtained appears, whereas the transparent films, when separated from one another, individually serve as plate-making films for different colors. This eliminates the image obliterating and color separation procedure conventionally required to greatly reduce the number of steps and shortens the time taken.

BRIEF DESCRIPTION OF THE DRAWINGS

FIG. 3 is a diagram showing the steps of preparing a print sample;

FIG. 4 is a sectional view showing an exposure method for preparing an intaglio plate;

FIG. 5 is a sectional view showing how the assembly of a negative film and a photosensitive paper is exposed to light;

FIG. 6 is a sectional view showing an enlarger; and

FIG. 7 is a diagram showing a conventional plate making process.

DETAILED DESCRIPTION OF THE INVENTION

Figure 1:
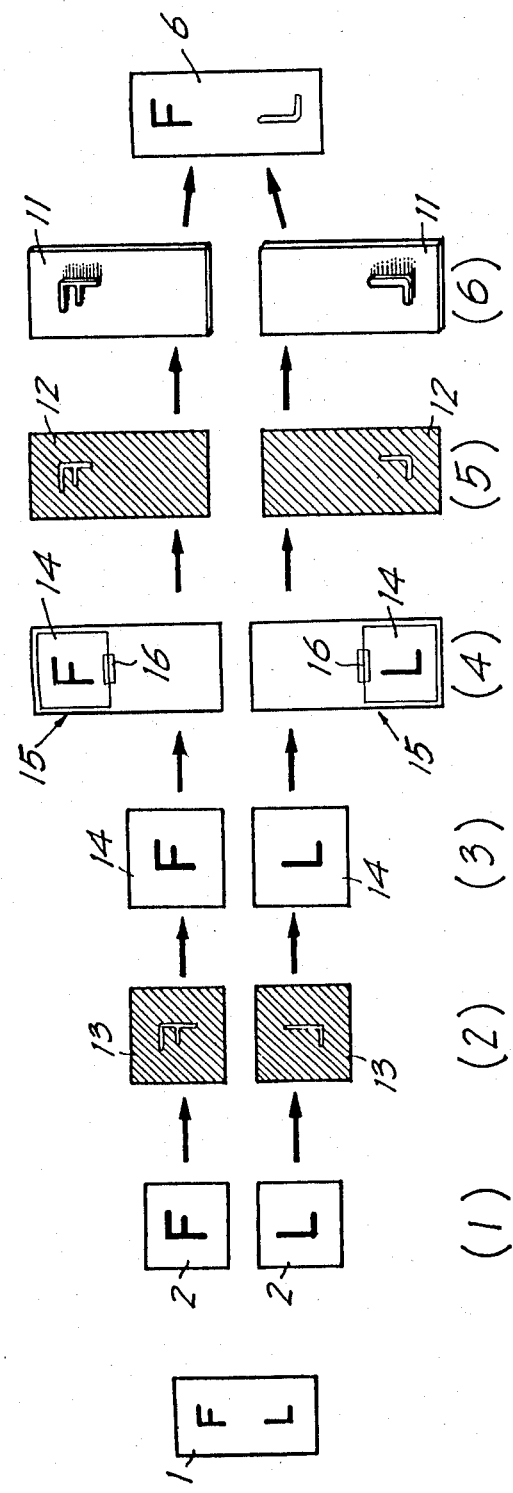
FIG. 1 is a diagram showing the steps of a process of the invention.

FIG. 1 shows an exemplary process embodying the present invention for preparing printing plates 11 from a rough sketch 1. The plates 11 are adapted for making finished two-color prints 6. The process comprises the following steps.

First step

The rough sketch 1 is separated into colors by drawing originals 2 on paper for the printing plates 11 for different colors.

Second step

Each of the originals 2 is photographed with a letter-press camera on the specified enlarged or reduced scale to prepare a nagative film 13 bearing a reverse image for the given color.

The negative films 13 for the different colors can of course be prepared by making a multi-color original 18 first without making the originals 2 for the different colors, and photographing the original 18 in the usual manner with use of color filters.

Third step

The negative film 13 is place on the same kind of film with the coated surface of the film 13 out and with the film substrate thereof in contact with the latter, and the assembly is exposed to light to obtain a transparent film piece 14 bearing a normal image thereon.

Fourth step

Transparent films 15 of the same size as the print 6 to be obtained are prepared in the same number as the number of the colors. Each film piece 14 is laid out on each transparent film 15 for color separation and is affixed thereto with an adhesive tape 16 or an adhesive.

Thus images of the same color are collected on the same transparent film 15, so that this step corresponds to the conventional image obliterating color separation step.

The transparent film 15 having the film piece 14 affixed theeto and prepared for the particular color corresponds to the color separation film 10 prepared from the image-obliterated negative film 9 for color separation by the conventional process of FIG. 7. Accordingly the step of preparing the transparent film 15 is followed by the same steps as in various known plate making processes for preparing relief plates, lithographic plates and like printing plates. The transparent film 15 is used for producing the printing plate 11 by further steps which will be described with reference to FIG. 1.

Fifth step

Each transparent film 15 thus obtained for the given color is set on the enlarger 23 with the film 15 up and the film piece 14 down and then illuminated with light to obtain a plate-making negative 12 having a reverse image contracted in the direction of rotation of the printing roller.

Sixth step

The printing plate 11 is prepared from the negative 12 in the same manner as heretofore known.

Unlike the conventional process shown in FIG. 7, the present process includes the step of affixing transparent film pieces to transparent films 15 individually for different colors to thereby totally eliminate the most cumbersome, inefficient manual steps of layout, image obliteration and color separation. The present invention further reduces the number of films to be consumed.

The film piece 14 used can be separated from the transparent film 15 for storage and repeated used by removing the adhesive tape 16 or adhesive. This assures efficient work and a reduced cost.

In the first step, the originals may be prepared from the rough sketch 1 by drawing the images on transparent films to obtain fair copies which are identical with the positive film pieces 14 resulting from the third step. The first and second step can then be omitted.

Figure 2:
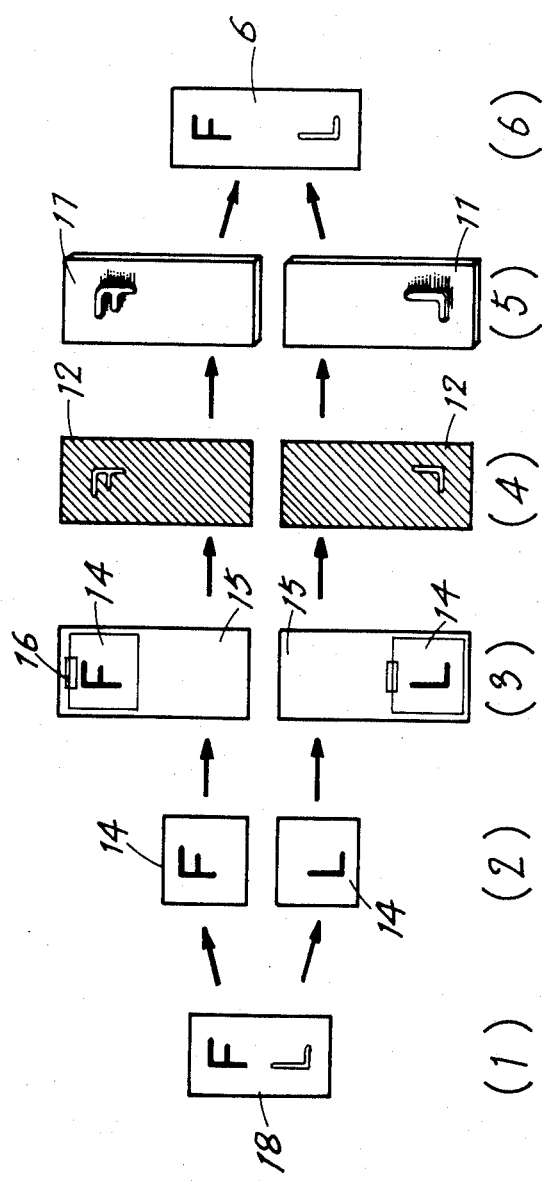
FIG. 2 is a diagram showing another process embodying the invention.

FIG. 2 shows another embodiment of the invention which comprises three steps of preparing from a multicolor original 18 transparent films 15 having film pieces 14 laid out thereon.

First step

The images to be printed are drawn on a sheet of paper to obtain the multicolor original 18.

Second step

The multicolor original 18 is photographed on positive-positive films directly through the lens without usig a mirror for reflection but using color filters for color separation to obtain positive film pieces 14.

Third step

The positive film pieces 14 are laid out on transparent films individually for the different colors and then affixed thereto with an adhesive tape 16 or adhesive to prepare color separation transparent films 15.

The same steps as in the embodiment of FIG. 1 or in the conventional plate making process are thereafter performed to prepare plate-making negatives 12 for the different colors with use of an enlarger, and printing plates 11 with use of the negatives 12. Thus the desired print 6 can be obtained.

FIG. 3 shows a process wherein the color separation transparent films 15 obtained by the process of FIG. 1 or 2 are used for making lithographic plates 17, which are used for offset-printing a proof sheet during the plate making process.

Step A

The transparent films 15 each bearing a layout for the given color as stated above are used as original films for the different colors.

Step B

As shown in FIG. 4, the transparent film 15 having the film piece 14 affixed thereto is placed on an aluminum plate (PS plate) 17a coated with a photosensitive agent, and the assembly is exposed to light. The exposed area only of the photosensitive agent, which is insoluble, is made soluble by photoreaction and then chemically etched away to obtain the lithographic plate 17.

As already known, an ink is applied to each lithographic plate 17 and then transferred to a blanket cylinder 28 and further to paper to obtain a finished multicolor print sample 48.

When the transparent film 15 having the film piece 14 thereon is fitted over the photosensitive surface of the aluminum plate 17a and exposed to light for preparing the print sample as shown in FIG. 4, the thickness of the film piece 14, as well as of the adhesive tape 16, is likely to produce a shade line, with the result that a thin line which is absent from the original will appear on the print sample 48. Since the thin line appearing on the sample 48 is attributable to the fact that the exposure lamp is a point light source, the shade line can be eliminated by using an increased number of exposure lamps or by placing a film 22 rough-surfaced by chemical etching or a rough-surfaced mat glass plate over the film piece 14 to hold the film piece and exposing the assembly to light to scatter the light as shown in FIG. 4.

While several embodiments of the invention have been described above with reference to the drawings for illustrative purposes, the invention can be practiced in various modified modes by changing the positive-negative film relationship and the normal-reverse image relationship as already known. Such modifications are to be construed as being embodiments of the invention unless they depart from the inventive scope defined in the appended claims.

What is claimed is:

1. In a process for preparing a printing plate the process characterized by the steps of:
    forming individual positive images of printing plate images to be reproduced on an individual of a plurality of transparent film pieces selected by image and color, each of said film pieces respectively being of a dimensional size less than the dimensional size of the printing plate to be prepared;
    detachably superposing the transparent film pieces bearing the positive images of like color unto a transparent film of size corresponding generally with the size of printing plate to be prepared individually for a respective color; and
    optically utilizing the superposed transparent film pieces and transparent film for preparing a printing plate bearing said images.

2. A process as defined in claim 1 wherein in the step of making the printing plate, a photosensitive material is exposed to the image of the transparent film having the transparent film piece thereon to obtain a finished film, and a photosensitive plate-making material is exposed to the image of the finished film to obtain the printing plate.

3. A process as defined in claim 1 wherein in the step of making the printing plate, a photosensitive plate-making material is exposed to the image of the transparent film having the transparent film piece thereon to obtain the printing plate.

4. A process as defined in claim 3 wherein the photosensitive plate-making material is exposed to the image of the transparent film having the transparent film piece thereon with a light scattering material disposed between the transparent film image and a light source to obtain the printing plate.

5. A process as defined in claim 1 wherein a plurality of originals each having a positive image are prepared for printing plates individually for different colors, and the steps are performed for each of the colors.

6. A process as defined in claim 4 wherein an original having the positive image for the printing plate is prepared by drawing a colored image on a sheet of paper and is photographed with use of color filters to obtain transparent film pieces for color separation, and each of the transparent film piece is laid out detachably on the transparent film for the color concerned, the steps being performed for each of the separated colors.

* * * * *